(12) United States Patent
Hsu et al.

(10) Patent No.: US 6,791,136 B1
(45) Date of Patent: Sep. 14, 2004

(54) MEMORY DEVICE STRUCTURE AND METHOD OF FABRICATING THE SAME

(75) Inventors: Hann-Jye Hsu, Taichung Hsien (TW); Chih-Wei Hung, Hsin-chu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/604,366

(22) Filed: Jul. 15, 2003

Related U.S. Application Data

(62) Division of application No. 10/064,383, filed on Jul. 9, 2002, now Pat. No. 6,642,111.

(51) Int. Cl.[7] .................. H01L 27/108; H01L 29/94; H01L 31/119
(52) U.S. Cl. .......................... 257/296; 257/68
(58) Field of Search .................. 257/296, 68, 288, 257/314, 315, 377, 380, 382, 412, 413

(56) References Cited

U.S. PATENT DOCUMENTS

| 5,585,293 | A | * | 12/1996 | Sharma et al. | 257/316 |
| 5,643,812 | A | * | 7/1997 | Park | 438/266 |
| 5,950,088 | A | * | 9/1999 | Park | 438/266 |
| 6,455,362 | B1 | * | 9/2002 | Tran et al. | 438/194 |

* cited by examiner

Primary Examiner—David Nhu
(74) Attorney, Agent, or Firm—Jiang Chyun IP Office

(57) ABSTRACT

A method of fabricating a memory device structure, where the method includes the steps of forming a tunnel oxide layer, a silicon nitride layer and a silicon oxide layer. A conductive layer is then formed on top of the silicon oxide. The conductive layer is then patterned to form a conductive gate layer. The silicon oxide layer is patterned during the same step of patterning the conductive layer, exposing the silicon nitride layer. Following that, a blanket dielectric layer is then formed on the substrate. This blanket dielectric layer is patterned with one etch step to form a spacer wall at the sides of the conductive gate layer.

7 Claims, 3 Drawing Sheets

MEMORY DEVICE STRUCTURE AND METHOD OF FABRICATING THE SAME

CROSS REFERENCE TO RELATED APPLICATIONS

This application is a divisional application of, and claims the priority benefit of, U.S. application Ser. No. 10/064,383 filed on Jul. 9, 2002 now U.S. Pat. No. 6,642,111.

BACKGROUND OF INVENTION

1. Field of the Invention

This invention relates to a semiconductor device structure and the method of fabricating the same. More particularly, this invention relates to a memory device structure and the method of fabricating the same.

2. Background of the Invention

Typical flash memory cells use poly-silicon to form the floating gate. During programming, the electrons injected into the floating gate are distributed uniformly on the whole layer of the floating gate. However, when the tunnel oxide under the poly-silicon floating gate has defects, the device tends to have leakage current, resulting in reliability issues.

Thus, a memory device has been developed which has a structure of Silicon-Oxide-Nitride-Oxide-Semiconductor (SONOS). When the voltage between the word line and the buried drain is being programmed, the electrons in the channel and close to the buried drain region are injected into the silicon nitride layer. Since silicon nitride has a special property of catching electrons, the injected electrons do not distribute uniformly on the whole silicon nitride layer. They rather crowd and localize on the silicon nitride layer with a Gauss's distribution. Because the electrons injected into the silicon nitride layer only distribute in a local region, the device is then not as sensitive to the defects of the tunnel oxide. As a result, it performs better with less leakage current.

FIG. 1A to FIG. 1C are cross-section process flow diagrams of an existing SONOS memory device.

Referring to FIG. 1A, a substrate 100 is provided first, where the substrate 100 has a memory cell region 120 and a periphery circuit region 130. Further, an oxide layer 102 is formed on the substrate 100. Afterwards, a silicon nitride layer 104 and an oxide layer 106 are formed on the oxide layer 102, and then the oxide layer 102, the silicon nitride layer 104 and the oxide layer 106 belonged to the periphery circuit region 130 are etched. A gate oxide layer 103 of the periphery circuit region 130 is grown by the wet oxidation method, without being grown in the memory cell region at this time. Then, at the same time, a poly silicon layer 108 is formed on top of the silicon oxide layer 106 in the memory cell region 120 and also on top of the oxide layer 103 in the region of the periphery circuit 130. A photo resist layer 110 is then patterned on top of the poly-silicon layer 108, covering the area where the gate structure is to be formed.

Referring to FIG. 1B, using the photo resist layer 110 as an etch mask, the stack of layers in the memory cell region 102 including the poly silicon layer 108, the silicon oxide layer 106, the silicon nitride layer 104 and the silicon oxide layer 102, as well as the stack in the periphery circuit region 130 including the poly silicon 108 and the silicon oxide 103, are patterned to form a gate structure in each of the two regions 120, 130 respectively. In the memory cell region 120, the formed gate structure comprises a tunnel oxide layer 102b, a silicon nitride electron-capturing layer 104b, a barrier oxide layer 106b and a poly-silicon layer 108b. In the periphery circuit region 130, on the other hand, the formed gate structure comprises a gate oxide layer 103a and a poly-silicon layer 108a. Further, the gate structures are used to be masks during the ion implantation forming the lightly doped drain regions 112b, 112a in the substrate 100 around the gate structures in regions 120 and 130, respectively.

Following that, referring to FIG. 1C, spacer walls 114b, 114a are formed surrounding the gate structures in the memory region 120 and the periphery circuit region 130, respectively. The spacer walls 114b, 114a are then used as another mask of implantation to form the source and drain regions 116b, 116a in the substrate 100, surrounding the spacer walls 114b, 114a. After this, one can precede with the metal wire layers and other backend processes to complete the memory processing.

In the above stated process steps of fabricating the memory device, the patterning of the poly-silicon is etched in one step for both memory region and periphery region, and following the poly-silicon etch is the etch for the oxide-nitride-oxide (O—N—O) layer in the memory region and the etch for the gate oxide in the periphery circuit region.

However, due to the big difference between the thickness and structures of O—N—O layer in the memory region and that of the gate oxide layer in the periphery circuit region, and provided that the gate oxide thickness is getting thinner and thinner for the 0.25 μm process and under, it is difficult to control the etching to completely etch through the O—N—O structure without lowering (or pitting) the substrate surface in the periphery circuit region by over-etching the gate oxide. In order to solve the above process issue, another existing method is separating the poly-silicon etch step into two steps for the periphery circuit region and the memory region, insuring the completeness of the device. However, this method must use one additional photolithography mask, thus adding process complexity.

SUMMARY OF INVENTION

Therefore, it is an object of the invention is to provide a SONOS memory device structure and its fabrication method, so as to solve the problem of having damaged substrate surface in the periphery circuit region during poly-silicon etch.

It is another object of the invention to provide a memory device structure and its fabrication method, so as to reduce process complexity.

The invention provides a method of fabricating a memory device. The method includes the following steps. First, from the substrate and up, a tunnel oxide layer, a silicon nitride layer and a barrier silicon oxide layer are formed consecutively. A conductive layer is formed right on top of the last silicon oxide layer. This conductive layer is then patterned, and, at the same time the silicon oxide layer is also patterned, exposing the silicon nitride layer. Following that, a blanket dielectric layer is formed on top, covering the gate layer and the silicon nitride layer. This dielectric layer is then defined by using one etch step to form a spacer wall on the sides of the gate layer. During this etch step, the silicon nitride layer not covered by the spacer wall can be advantageously etched away and form the silicon nitride electron capturing layer. Note that the width of the formed electron-capturing layer is larger than that of the conductive gate layer. The current invention also includes forming a source/drain area in the substrate around the spacer, and forming a silicide layer on top of the gate layer to reduce the gate contact resistance.

The invention provides a method of fabricating a memory device. The method includes the following steps. First, a substrate is provided which has a memory region and a periphery circuit region. Secondly, an oxide layer is formed on the surface of the substrate, and a silicon nitride layer and another dielectric layer are formed on top of the oxide layer at only the memory region. After that, a conductive layer is formed on top of the dielectric layer at the memory region and the oxide layer at the periphery circuit region. This conductive layer is then patterned to form a first gate at the memory region and a second gate at the periphery circuit region. During this patterning step, the dielectric layer at the memory region and the oxide layer at the periphery circuit region are also patterned in the same step, exposing the silicon nitride layer in the memory region. A blanket dielectric layer is then formed on top, covering the first gate, the silicon nitride layer, and the second gate in both regions. Following that, an etch step is used to pattern the blanket dielectric layer and form a spacer on the sidewall of the first gate, and form another spacer on the sidewall of the second gate. During this patterning step, the silicon nitride layer in the memory region not covered by the spacer is also removed, forming the silicon nitride electron-capturing layer. Note that the width of the formed electron-capturing layer is larger than that of the conductive gate layer. The current invention also includes forming a source/drain area in the substrate around the spacer, and forming a suicide layer on top of the gate layer to reduce the gate contact resistance.

The invention also provides a memory device structure, which includes a substrate, a tunnel oxide layer, a silicon nitride electron-capturing layer, an oxide layer, a conductive gate layer and a silicon nitride spacer wall. In this structure, the tunnel oxide layer is deposed above the substrate surface. The silicon nitride electron-capturing layer is deposed above and in contact with the tunnel oxide layer. The conductive gate layer is deposed above a portion of the electron-capturing layer. The width of the electron-capturing layer is larger than that of the conductive gate layer. The oxide layer is deposed in between the gate layer and the silicon nitride electron-capturing layer so as to isolate the conductive gate layer and the silicon nitride electron-capturing layer. In addition, the silicon nitride spacers are deposed above the silicon nitride electron-capturing layer and on the sidewalls of the conductive gate layer and the silicon oxide layer. The current invention also includes forming a source/drain area in the substrate around the spacer, and forming a silicide layer on top of the gate layer to reduce the gate contact resistance.

In the method of fabricating the SONOS memory device in the current invention, during the step of patterning the poly-silicon layer, the top silicon oxide layer of the stack of silicon oxide-silicon nitride-tunnel oxide is patterned, stopping on the silicon nitride layer, thereby avoiding damaging the substrate of the periphery circuit region during the etching process.

Furthermore, in the method of fabricating the SONOS memory device in the current invention, because the etch step can be processed at the same time for both memory region and the periphery circuit region, there is then no need for an extra photo/etch step, thereby simplifying the process and making it suitable for the embedded processing.

Also, in the SONOS memory device structure of the current invention, the silicon nitride electron-capturing layer is larger. As a result, more electron-capturing area is provided, thereby increasing the threshold voltage window during programming.

BRIEF DESCRIPTION OF DRAWINGS

The invention and its purposes, features, and advantages can be more fully understood by reading the following detailed description of the preferred embodiments with reference made to the accompanying drawings.

DETAILED DESCRIPTION

Figure 1A:
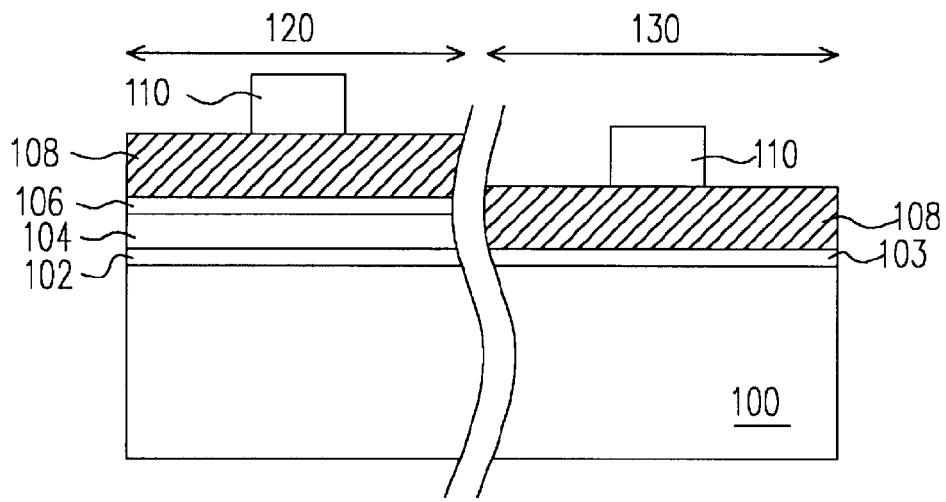
FIGS. 1A to 1C are schematic diagrams showing a cross-section fabrication flow for an existing SONOS memory device.
Figure 1B:
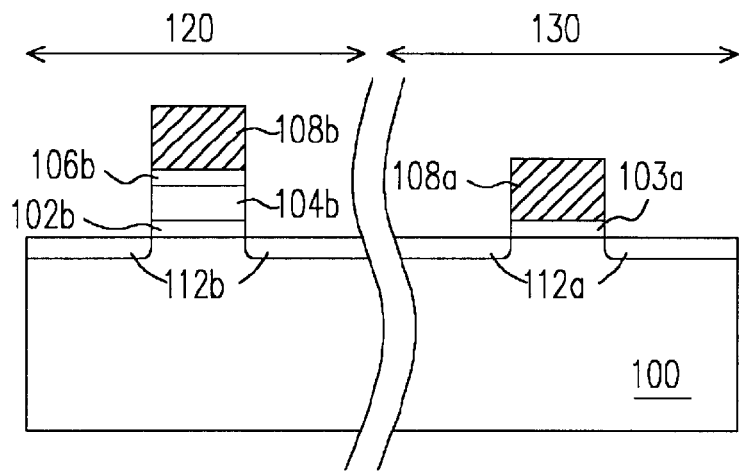
Figure 1C:
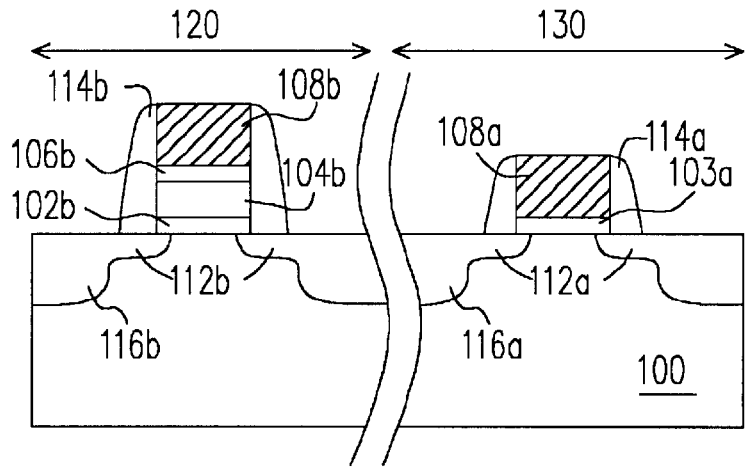
Figure 2A:
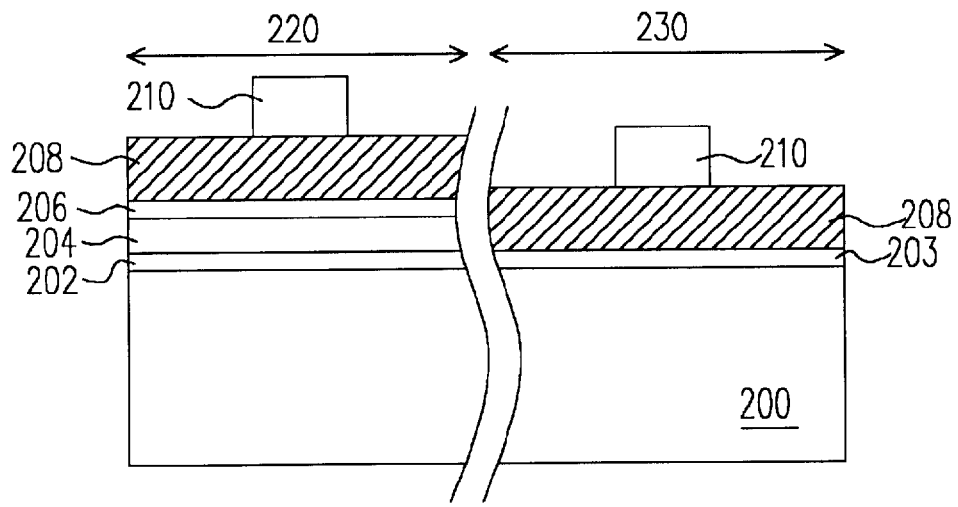
FIGS. 2A to 2E are schematic diagrams showing a cross-section fabrication flow for the SONOS memory device of a preferred embodiment of the current invention.

Referring to FIG. 2A, a substrate 200 is provided, where the substrate 200 includes a memory region 220 and a periphery circuit region 230. An isolation region (not shown) is formed above the substrate, forming an active region (not shown). A well region (not shown) is then formed in the substrate 200. Then, an oxide layer 202 is formed above the substrate 200. After that, a silicon nitride layer 204 and a silicon oxide layer 206 are formed above the oxide layer 202. The silicon nitride layer 204 can be substituted with other materials having the property of storing and capturing electrons. Similarly, the silicon oxide layer 206 can also be substituted with other di-electric materials. The oxide layer 202, the silicon nitride layer 204 and the oxide layer 206 belonged to the periphery circuit region 230 are further etched, and thereafter, a gate oxide layer 203 of the periphery circuit region 230 is grown by the wet oxidation method.

A poly-silicon layer 208 is then formed on the above structure, covering both the oxide layer 206 in the memory region 220 and the silicon oxide layer 203 in the periphery region 230, at the same time. The poly-silicon layer 208 can be substituted with other conductive materials, where any material, which can be used as gate material, is considered suitable for this invention. After that, a photo resist pattern layer 210 is then formed above the poly-silicon layer 208, covering the area where the gate structure is to be formed.

Figure 2B:
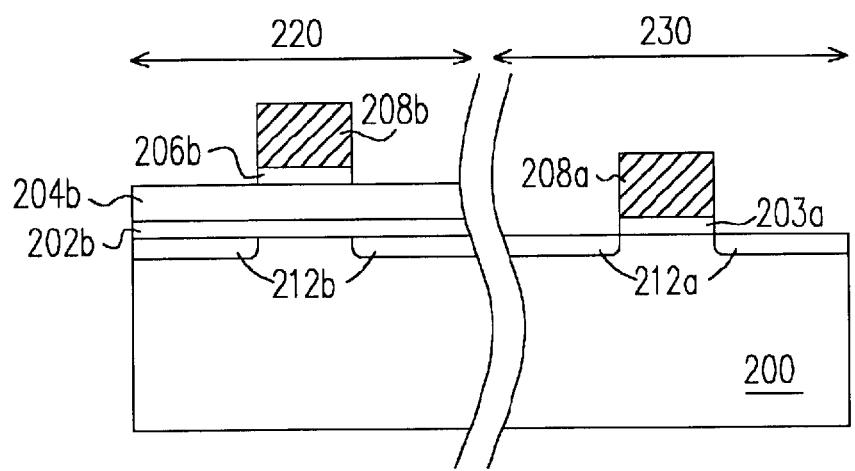

Referring to FIG. 2B, using the photo resist layer 210 as an etch mask, the poly-silicon layer 208, as well as the silicon oxide layer 206 in the memory region 220, together with the poly-silicon layer 208 and the silicon oxide layer 203 in the periphery circuit region 230, are all patterned in an etch step, forming conductive gate structures 208b, 208a in the memory region 220 and the periphery circuit region 230, respectively. During this etch step, the silicon nitride layer 204 in the memory region 220 is exposed outside of the area covered by the gate 208b. Since the etch selectivity is higher between the silicon oxide layers 206, and the silicon nitride layer 204, the etch process can thus be controlled and stopped at the silicon nitride layer 204. This makes it easy to control the etch step so as to prevent the substrate 200 surface in the periphery circuit region from being etched down due to the over etching.

Next, the conductive gate structures 208b, 208a are used as the implant masks to form lightly doped drain regions 212b, 212a in the substrate 200 on the sides of the gate structures 208b, 208a, respectively.

Figure 2C:
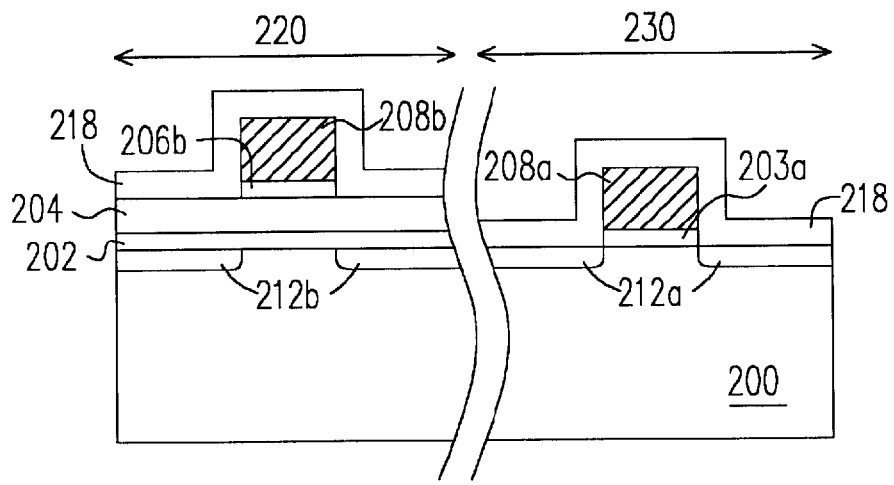

Referring to FIG. 2C, a blanket dielectric layer 218 is then formed above the substrate 200, covering the conductive gate structures 208b, 208a and the silicon nitride layer 204, wherein the most preferred material for the blanket dielectric layer 218 is silicon nitride.

Figure 2D:
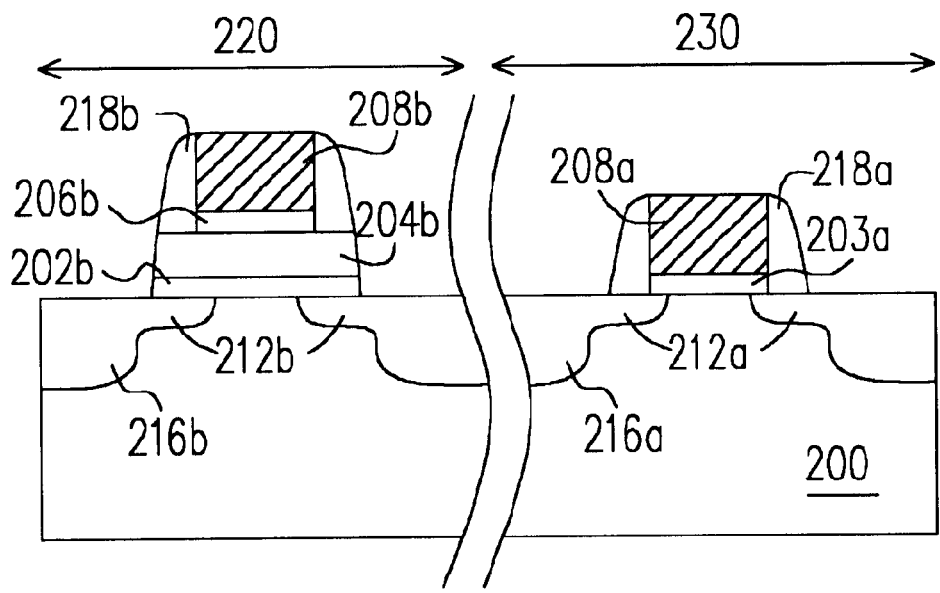

Referring to FIG. 2D, with one etch process step to the blanket dielectric layer 218, spacer wall structures 218b and 218a are formed at the sidewalls of the gate structures 208b and 208a, respectively. Since the material of the blanket dielectric layer 218 is also silicon nitride, the underneath silicon nitride layer 204 can be removed at the same time in the area not covered by the gate 208b and the spacer wall 218b, to form a silicon nitride electron-capturing layer 204b.

Note that the width of the formed silicon nitride electron-capturing layer 204b is larger than that of the conductive gate structure 208b. In other words, the width of the silicon nitride electron-capturing layer 204b in this invention can be larger than that of the existing memory devices. Therefore, the memory device in this invention can provide more electron-capturing area, and, as a result, provide wider threshold voltage window during programming.

Next, source/drain regions 216b, 216a are formed in the substrate 200 at the sides of the spacers 218b, 218a by using the spacers 218b, 218a as the implant masks.

Figure 2E:
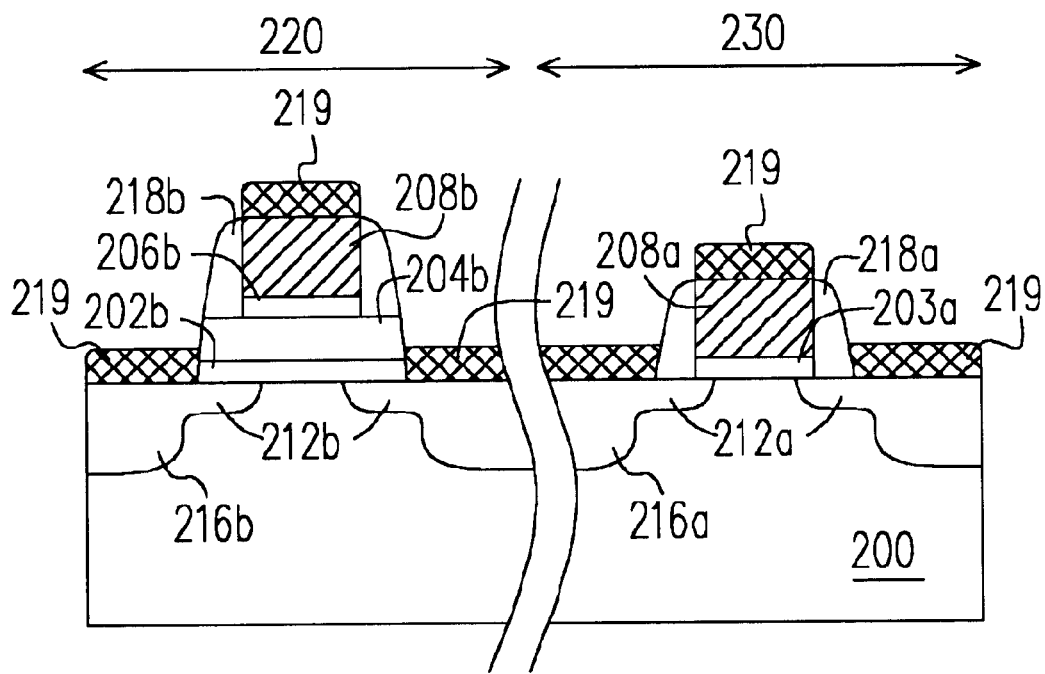

Referring to FIG. 2E, the memory device of this invention further includes a metal silicide material 219 on the top surface of the gate structures 208b, 208a, and on the surface of the substrate above the areas of the source/drain regions 216b, 216a. The method of forming the metal silicide layer 219, for example, includes forming a metal layer on top of the substrate 200, followed by a heating process to enable a reaction between the metal and the silicon material not covered by the spacers 218b, 218a. The metal suicide layer 219 can be, for example, cobalt silicide.

Finally, the memory device fabrication is completed by finishing up the metal wiring and other backend processes.

The memory device in this invention includes a memory region 220, a periphery circuit region 230 and a substrate 200. The memory region 220 further includes a conductive gate layer 208b, a tunnel oxide 202b, a silicon nitride electron-capturing layer 204b, a silicon oxide layer 206b, a silicon nitride spacer wall 218b, and a source/drain region 216b. Additionally, the periphery circuit region 230 further includes a gate oxide layer 203a, a conductive gate layer 208a, a silicon nitride spacer wall 218a and a source/drain region 216a.

In the memory region 220, the tunnel oxide layer 202b is disposed on the surface of substrate 200. The silicon nitride electron-capturing layer 204b is disposed on the tunnel oxide layer 202b. The silicon oxide layer 206b is disposed on the silicon nitride electron-capturing layer 204b. And the conductive gate layer 208b is disposed on a portion of the silicon nitride electron-capturing layer 204b. The width of the silicon nitride electron-capturing layer 204b is larger than that of the gate 208b. Further there is a silicon oxide layer 206b which is disposed in between the conductive gate layer 208b and the silicon nitride electron-capturing layer 204b to isolate the above two layers 208b, 204b. In addition, the silicon nitride spacer 218b is disposed on top of the silicon nitride electron-capturing layer 204b and on the sidewalls of the gate layer 208b and the silicon oxide layer 206b. Furthermore, the source/drain region 216b is disposed in the substrate 200 and outside of the area covered by the silicon nitride spacer 218b.

Additionally, in the periphery circuit region 230, the gate oxide layer 203a is disposed on the top surface of the substrate 200. The gate layer 208a is disposed on the gate oxide layer 203a, and the silicon nitride spacer 218a is disposed at the sidewalls of the gate layer 208a and the gate oxide layer 203a. The source/drain region 216a is disposed in the substrate 200, in the area outside of the silicon nitride spacer 218a.

The memory device of the current invention further includes a metal silicide layer 219 disposed on the top surface of the gate layer 208b, 208a as well as on the top surface of the substrate 200 above the source/drain region 216b, 216a, where the silicide layer 219 is used for reducing the resistance value of the gate layers 208b, 208a and the source/drain regions 216b, 216a.

In the method of fabricating the SONOS memory device of this invention, since the step of patterning the conductive gate layer only includes patterning the poly-silicon layer and the top silicon oxide layer of the stack of oxide-silicon nitride-silicon oxide and stopping at the silicon nitride layer, the problem of over etching into the substrate and causing a lowered substrate surface in the periphery circuit region can be prevented. Also, in the method of fabricating the SONOS memory device, since the poly-silicon can be patterned in both the memory region and the periphery circuit region without an extra photolithography/etch step, the process can be simplified and used in embedded processes. In addition, in the SONOS memory device of the invention, since the width of the silicon nitride electron-capturing layer is larger than that of the existing silicon nitride electron-capturing layer, the device can provide more electron-capturing area, and as a result, increase the threshold voltage window during programming.

In summary of the above description, the current invention has the following advantages.

1. The method of fabricating the memory device of the invention can prevent substrate damage in the periphery circuit region during the etching process.

2. The method of fabricating the memory device can simplify process, and can be used in embedded processes.

3. The memory device structure of the invention can increase the threshold voltage window during programming.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A memory device structure, comprising:

a substrate;

a tunnel oxide layer, which is disposed on the substrate;

an electron-capturing layer, which is disposed on the tunnel oxide layer;

a conductive gate layer, which is disposed on a portion of the electron-capturing layer, wherein the electron-capturing layer has a width larger than that of the conductive gate layer;

a dielectric layer, which is disposed in between the conductive gate layer and the electron-capturing layer; and a spacer wall, which is disposed on the electron-capturing layer and on sidewalls of the conductive gate layer and the dielectric layer.

2. The memory device structure according to claim 1, wherein the electron- capturing layer further comprises a material of silicon nitride.

3. The memory device structure according to claim 1, wherein the spacer wall is a silicon nitride spacer wall.

4. The memory device structure according to claim 1, wherein the dielectric layer is made of materials including silicon oxide.

5. The memory device structure according to claim 1, wherein the conductive gate is made of materials including poly-silicon 6. The memory device structure according to claim 1 further comprises a source/drain region in the substrate outside of the spacer wall.

7. The memory device structure according to claim 1 further comprises a metal-silicon compound material layer on top of the conductive gate layer.

* * * * *